(12) United States Patent
Ishikawa

(10) Patent No.: US 7,631,285 B2
(45) Date of Patent: Dec. 8, 2009

(54) SUPPORT METHOD FOR DESIGNING A SEMICONDUCTOR DEVICE

(75) Inventor: Hirotaka Ishikawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 181 days.

(21) Appl. No.: 11/636,443

(22) Filed: Dec. 11, 2006

(65) Prior Publication Data

US 2007/0136715 A1    Jun. 14, 2007

(30) Foreign Application Priority Data

Dec. 12, 2005    (JP)    ............................. 2005-358223

(51) Int. Cl.
*G06F 17/50* (2006.01)
*H03K 19/00* (2006.01)

(52) U.S. Cl. .......................................... 716/17; 716/12
(58) Field of Classification Search ................... 716/17, 716/12

See application file for complete search history.

(56) References Cited

U.S. PATENT DOCUMENTS

| | | | | |
|---|---|---|---|---|
| 5,375,069 A | * | 12/1994 | Satoh et al. | 716/14 |
| 5,717,600 A | * | 2/1998 | Ishizuka | 716/14 |
| 6,704,918 B1 | * | 3/2004 | Ali et al. | 716/12 |
| 6,714,903 B1 | * | 3/2004 | Chu et al. | 703/19 |
| 2004/0123262 A1 | * | 6/2004 | Shirota et al. | 716/14 |

FOREIGN PATENT DOCUMENTS

JP    2003-141200    5/2003

* cited by examiner

*Primary Examiner*—Jack Chiang
*Assistant Examiner*—Magid Y Dimyan
(74) *Attorney, Agent, or Firm*—Young & Thompson

(57) ABSTRACT

In a support method of designing a semiconductor device, a plurality of wiring lines are arranged in parallel in a wiring line layer to transfer a same signal. A wiring line inhibition area is set in the wiring line layer to cover a space between the plurality of wiring lines and to inhibit arrangement of another wiring line other than the plurality of wiring lines.

20 Claims, 13 Drawing Sheets

SUPPORT METHOD FOR DESIGNING A SEMICONDUCTOR DEVICE

BACKGROUND OF THE INVENTION

1. Field of the Invention

The present invention relates to a semiconductor device. More particularly, the present invention relates to a support method for designing a layout of wiring lines of a semiconductor device.

2. Description of the Related Art

In a semiconductor device, there is a case that an upper limit is set for a resistance value of wiring lines for connection between macro cells. For example, an upper limit of the resistance value to power supply wiring lines for connection to analog circuit macro cells is set because of an analog property. Conventionally, as wiring line material, Al is used in many cases. In that case, in order to decrease the resistance value, a wiring line width is set relatively wide.

In recent years, as the wiring line material for a lower resistance value, Cu has been mainly introduced instead of Al. When Cu is used as the wiring line material, a phenomenon referred to as dishing is generated in a manufacturing process if the wiring line is designed to be wide. Specifically, at a CMP (Chemical Mechanical Polishing) step when a device is manufactured, a concave portion such as the shape of a dish is formed in the surface of the wide Cu wiring line. This implies the reduction in the flatness of the Cu wiring line and the reduction in a film thickness, and consequently leads to increase in the wiring line resistance.

In order to suppress the dishing, it is necessary at the designing stage to limit the wiring line width to a predetermined upper value or less. In order to meet the limit of the wiring line width and meet the upper limit of the resistance value, one wiring line may be considered to be divided into a plurality of thin wiring lines. For example, in FIG. 1, a power supply wiring line for connection between a first macro cell 101 and a second macro cell 102 is divided into a plurality of wiring lines 110 (hereafter, referred to as [Split Wiring Lines 110]). The plurality of split wiring lines 110 are a wiring line to send a same signal between the macro cells, and their potentials are all equal to each other. That is, the plurality of split wiring lines 110 can be collectively referred to as a bundle of wiring lines 111 to send a certain signal. Since the width W of each split wiring line 110 is limited, the dishing is suppressed. Also, the resistance value is decreased due to the bundle of wiring lines 111, thereby satisfying the limit on the resistance value.

The line width W of the split wiring line 110 is limited, and a certain limit is simultaneously imposed on a wiring line interval G between the split wiring lines 110. This is because a phenomenon of [Erosion] is caused in the manufacturing process if the wiring lines adjacent to each other are excessively close. The erosion is the phenomenon that an insulating film in a region where the wiring lines are dense is peeled together with Cu at the CMP step. Consequently, the side of the formed Cu wiring line is eroded, and the wiring line width W is made narrower than a design value. That is, similarly to the dishing, the erosion also brings about the increase in the wiring line resistance. Thus, at the designing stage, the wiring line interval G is required to be kept equal to or more than a predetermined limit (lower limit).

As the technique related to the wiring line design, a layout design method is disclosed in Japanese Laid Open Patent Application (JP-P2003-141200A) that is intended to attain a design so that a wiring line occupation rate satisfies a predetermined standard. According to the layout design method, slit wiring lines are firstly arranged. Next, a wiring line occupation rate in a certain area including the slit wiring lines is calculated. Next, in accordance with the wiring line occupation rate, a wiring line inhibition area is calculated such that the wiring line occupation rate error is never caused in the subsequent wiring line steps. Next, the wiring line inhibition area having a calculated area is provided in the foregoing certain area. Here, the position and shape of the wiring line inhibition area are arbitrarily set.

AT this time, the inventor of the present invention noted the following points. As mentioned above, in a layout design of the relatively thick wiring line such as a power supply wiring line and the like, the layout of the bundle of wiring lines 111 is executed in order to suppress dishing in a manufacturing process. Moreover, in order to protect erosion, a limit is imposed on an interval between the split wiring lines 110 of the bundle of wiring lines 111. A lower limit of the wiring line interval G is determined in accordance with the wiring line width W. For example, an upper limit of the wiring line width W is set to 1 μm, and the lower limit of the wiring line interval G is set to 1 μm.

In the layout design of the semiconductor device, an automatic layout of a usual signal wiring line 120 is executed after the arrangement of the bundle of wiring lines 111 whose resistance value is limited, as shown in FIG. 1. As this usual signal wiring line 120 (hereafter, referred to as a usual wiring line 120), a logic wiring line for connection between the macro cells is exemplified, and the resistance value is not especially limited. The usual wiring line 120 is desired to be thinner than the split wiring line 110. For example, the wiring line width of about 0.1 μm is desired. Thus, with regard to the usual wiring line 120, an intrinsic design standard different from that for the split wiring line 110 is defined, and a lower limit of the wiring line interval is set to be extremely smaller than the wiring line interval G of the split wiring line 110.

Therefore, when the automatic layout of the usual wiring line 120 is executed after the arrangement of the bundle of wiring lines 111, as shown in FIG. 1, there is a possibility that an automatic layout is executed, namely, the usual wiring line 120 is automatically laid in the area between the adjacent split wiring lines 110. In short, there is a possibility that the usual wiring line 120 of the same layer is automatically laid in the area for the bundle of wiring lines 111 laid in a certain wiring line layer. This fact finally results in the erosion. That is, although the bundle of wiring lines 111 is laid with effort for the dishing/erosion countermeasure, the automatic layout causes the final occurrence of the erosion. As mentioned above, the erosion causes the increase in the wiring line resistance.

SUMMARY OF THE INVENTION

In an aspect of the present invention, a support method of designing a semiconductor device, is achieved by arranging a plurality of wiring lines in parallel in a wiring line layer to transfer a same signal; and by setting a wiring line inhibition area in the wiring line layer to cover a space between the plurality of wiring lines and to inhibit arrangement of another wiring line other than the plurality of wiring lines.

Here, the support method may be achieved by further arranging the other wiring line in an area of the wiring line layer other than the wiring line inhibition area.

Also, the wiring line width and the wiring line interval in the plurality of wiring lines are wider than those of the other wiring line.

Also, the setting may be achieved by setting the wiring line inhibition area to cover outer areas outside a leftmost one and a rightmost one of the plurality of wiring lines in addition to the spaces between the plurality of wiring lines. In this case, each of the outer areas may have a same width as the space between the plurality of wiring lines, and may be set such that the outer area is contact with the leftmost one or rightmost one of the plurality of wiring lines.

Also, the setting may be achieved by setting the wiring line inhibition area to cover at least a part of the plurality of wiring lines in addition to the space. In this case, the setting may be achieved by setting the wiring line inhibition area as a rectangular area to cover all of the plurality of wiring lines.

In another aspect of the present invention, a support method of designing a semiconductor device, is achieved by arranging a plurality of wiring lines in parallel in a wiring line layer to transfer a same signal; and by setting a wiring line inhibition area in the wiring line layer based on position data of the plurality of wiring lines to inhibit arrangement of another wiring line in a portion of the wiring line layer related to the plurality of wiring lines.

Here, the wiring line inhibition area may be set to cover a space between the plurality of wiring lines in the wiring line layer.

Also, the support method may be achieved by further arranging the other wiring line in the wiring line layer.

In another aspect of the present invention, a semiconductor device includes a first macro cell; a second macro cell; and a plurality of wiring lines configured to connect between the first macro cell and the second macro cell to transfer a same signal. Another wiring line other than the plurality of wiring lines is arranged an area of a wiring line layer other than spaces between the plurality of wiring lines.

Here, a wiring line width and a wiring line interval in the plurality of wiring lines may be wider than those of the other wiring line.

Also, the plurality of wiring lines may be a power supply wiring line which supplies a same power supply voltage.

DESCRIPTION OF THE PREFERRED EMBODIMENTS

Hereinafter, a method of supporting designing of a semiconductor device according to the present invention will be described in detail with reference to the attached drawings.

First Embodiment

Figure 1:
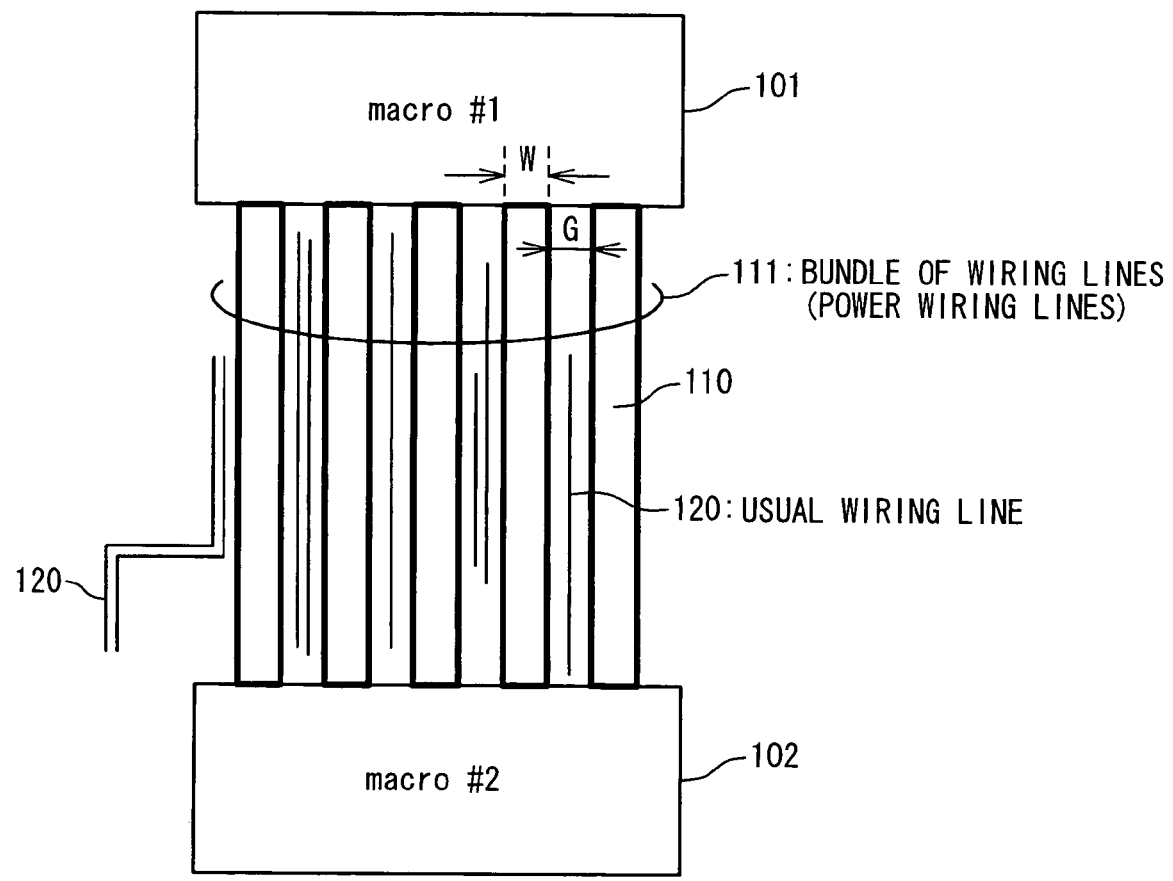
FIG. 1 is a diagram showing a method of designing a conventional semiconductor device.
Figure 2:
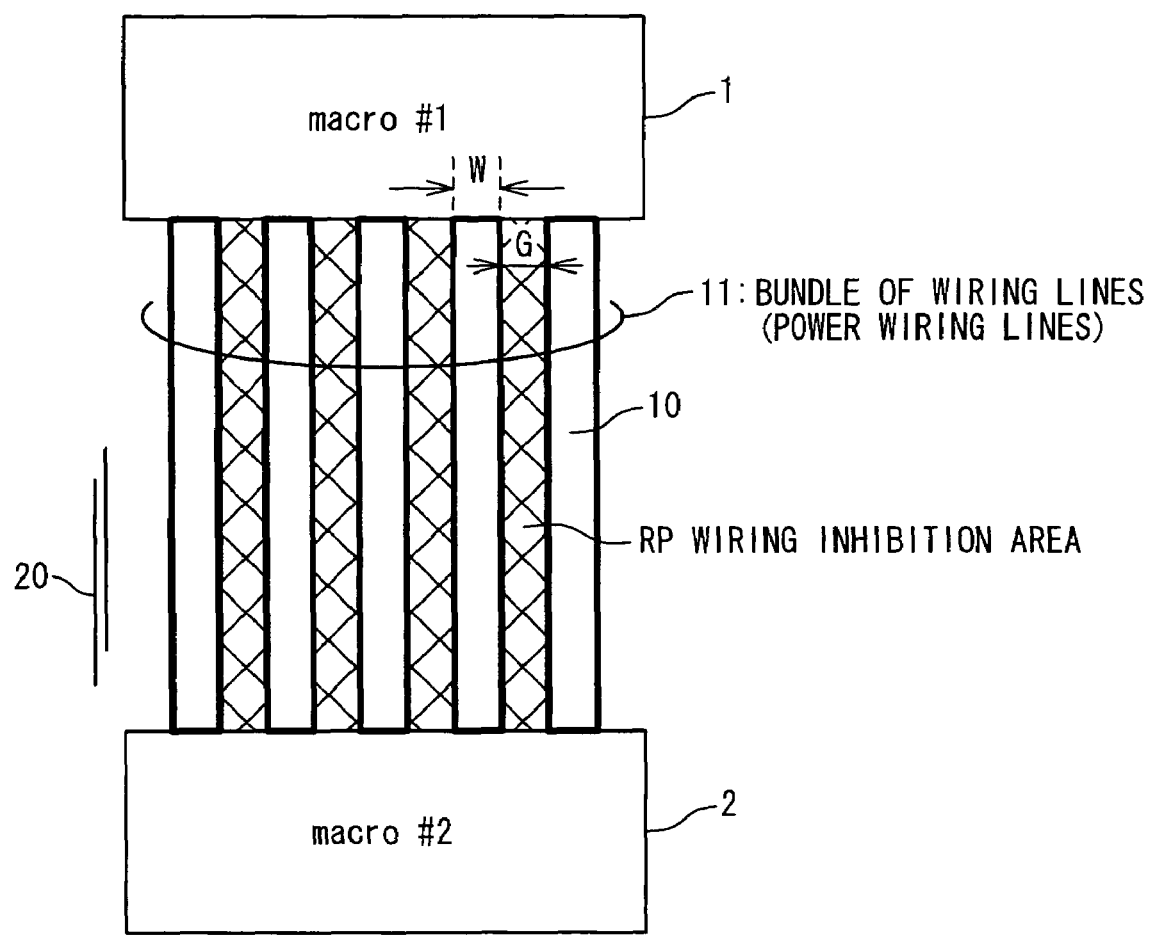
FIG. 2 is a diagram showing a method of designing a semiconductor device according to a first embodiment of the present invention.

A method of supporting the designing of a semiconductor device according to the first embodiment will be described below with reference to FIG. 2. At first, a first macro cell 1 and a second macro cell 2 are arranged at desirable positions. Those macro cells 1 and 2 are, for example, analog circuit macro cells. Subsequently, a layout of wiring lines (for example, power supply wiring lines) for connection between the macro cells 1 and 2 is executed. It is supposed that the upper limit of a resistance value is set for the wiring lines for the connection between the macro cells 1 and 2, because of analog characteristics. Also, it is supposed that Cu is used as material of the wiring lines for the connection between the macro cells 1 and 2.

According to this embodiment, the wiring line for the connection between the macro cells 1 and 2 is divided into a plurality of parallel split wiring lines 10. The number of the split wiring lines 10 is between 50 and 100, for example. Here, attention should be paid to a fact that the plurality of split wiring lines 10 are the wiring lines related to the same net (the connection between the macro cells 1 and 2) in a net list (connection information inside macro cell and between macro cells) and also the wiring lines to send the same signal from the first macro cell 1 to the second macro cell 2. In short, the plurality of split wiring lines 10 can be collectively referred to as a [Bundle of Wiring Lines 11] to send a certain signal. The bundle of wiring lines 11 composed of the plurality of split wiring lines 10 as mentioned above is arranged (laid out) in a certain wiring line layer.

The line width W of each split wiring line 10 is set to prevent a so-called dishing in a manufacturing process. Also, the line interval G between the split wiring lines 10 is set to prevent erosion in the manufacturing process. The lower limit of the wiring line interval G is determined in accordance with the wiring line width W. For example, the upper limit of the wiring line width W is set to 1 μm, and the lower limit of the wiring line interval G is limited to 1 μm.

According to this embodiment, a [Wiring Inhibition Area RP] is set in parallel to the arrangement of the bundle of wiring lines 11 or immediately after the arrangement of the bundle of wiring lines 11. This wiring line inhibition area RP is defined as a area, where the arrangement of any wiring line different from the bundle of wiring lines 11 is inhibited, in the wiring line layer where the bundle of wiring lines 11 is arranged. Moreover, according to this embodiment, as shown in FIG. 2, the wiring line inhibition area RP is formed or set to cover spaces between the plurality of split wiring lines 10 as mentioned above. It should be noted that the wiring line inhibition area RP is set only in the same wiring line layer as the wiring line layer where the bundle of wiring lines 11 is arranged.

Next, the automatic layout is performed on a usual wiring line 20 for signal transfer, different from the bundle of wiring lines 11 in the same wiring line layer. As the usual wiring line 20, a logic wiring line for connection between the macro cells is exemplified, and the resistance value is not especially limited. The usual wiring line 20 is thinner than the split wiring line 10. The wiring line width of the usual wiring line 20 is about 0.1 μμm, for example. Also, an intrinsic design standard different from the split wiring line 10 is defined with regard to the usual wiring line 20, and the lower limit of the wiring line interval is set to be extremely smaller than the wiring line interval G of the split wiring line 10. In short, conventionally, there was a margin where the usual wiring line 20 could be arranged in the space between the split wiring lines 10. However, according to this embodiment, since the spaces between the split wiring lines 10 are set as the wiring line inhibition area RP, the usual wiring line 20 is not arranged between the split wiring lines 10. In the wiring line layer where the bundle of wiring lines 11 is arranged, the usual wiring line 20 is arranged in an area other than the wiring line inhibition area RP.

As described above, according to this embodiment, an area between the plurality of split wiring lines 10 is set as the wiring line inhibition area RP at the designing stage. Thus, in the automatic layout, the usual wiring line 20 is prevented from being arranged in the spaces in the bundle of wiring lines 11. As a result, the occurrence of the erosion in the manufacturing process is suppressed, thereby suppressing the variation in the wiring line resistance caused by the erosion. The change in the wiring line resistance value is suppressed, and the desirable wiring line resistance value is obtained, thereby improving the reliability of the manufactured semiconductor device.

Figure 3:
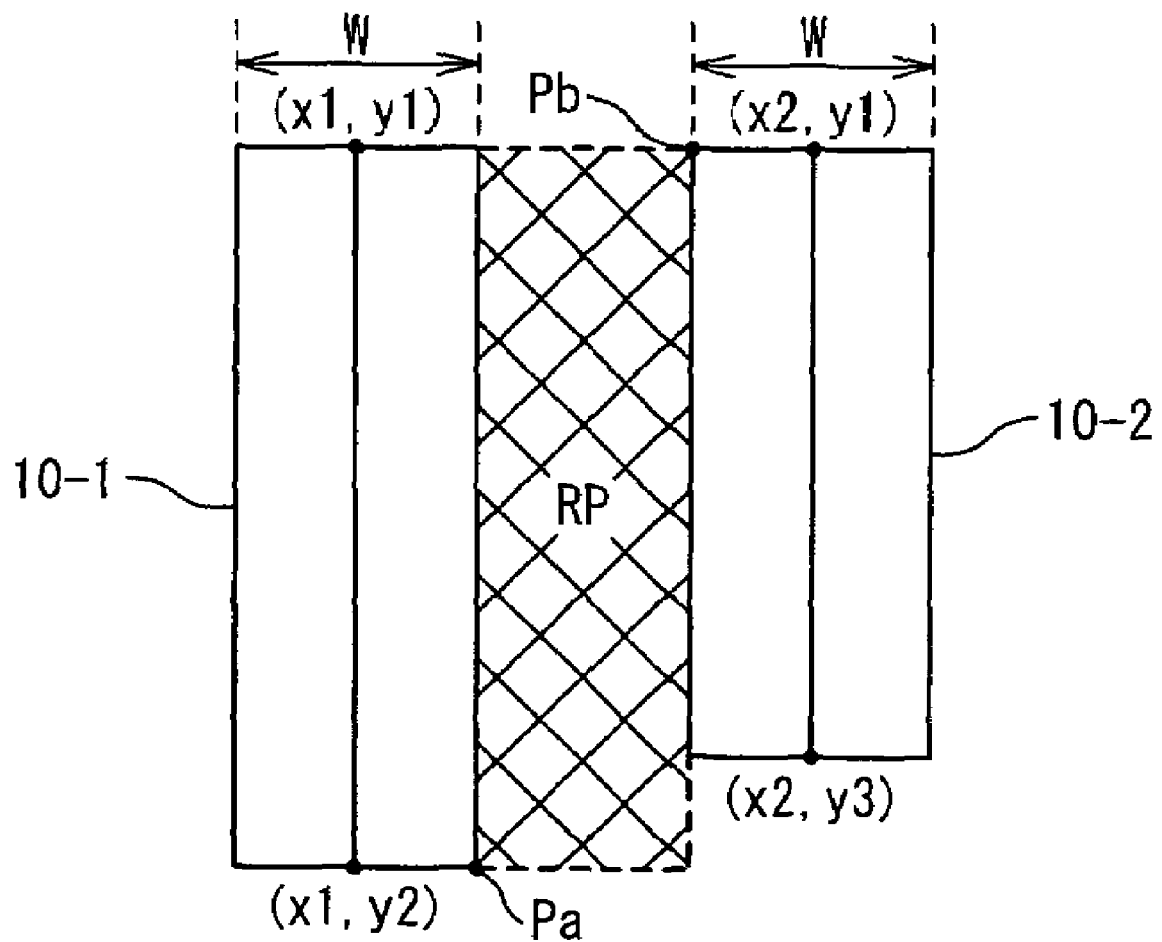
FIG. 3 is a diagram showing a method of determining a position of a wiring line inhibition area according to the first embodiment.

FIG. 3 shows one example of a method of determining a position of the wiring line inhibition area RP according to this embodiment. In the layout of the bundle of wiring lines 11, a segment (line) corresponding to each of the plurality of split wiring lines 10 is sequentially arranged. FIG. 3 shows two segments (split wiring lines) 10-1 and 10-2 among them. The position and shape of each segment are defined based on the coordinates of a start point and an end point, and the wiring line width W. Specifically, the start point of the segment 10-1 is given by the coordinate (x1, y1), and the end point is given by the coordinate (x1, y2). Also, the start point of the segment 10-2 is given by the coordinate (x2, y1), and the end point is given by the coordinate (x2, y3).

When the two segments 10-1 and 10-2 are arranged, it is possible to know the position data of the space between them. Thus, it is possible to determine a wiring line inhibition area RP to cover the space. In short, the position and shape of the wiring line inhibition area can be determined in accordance with the position data of the two segments 10-1 and 10-2. In FIG. 3, the coordinate of a lower right point Pa of the segment 10-1 and the coordinate of an upper left point Pb of the segment 10-2 are represented as follows:

Point $Pa=(x1+W/2,y2)$

Point $Pb=(x2-W/2,y1)$

Therefore, a rectangle defined by those two points Pa and Pb may be formed or set as the wiring line inhibition area. The set wiring line inhibition area obviously covers the space between the two segments 10-1 and 10-2. It should be noted that in the foregoing example, the wiring line inhibition area is set in accordance with the segment 10-1 that is a longer one of the segments 10-1 and 10-2. In this way, preferably, the wiring line inhibition area is set based on the maximal coordinate and the minimal coordinate. In that case, the space between the segments is perfectly covered.

In this way, according to this embodiment, the position (Pa, Pb) of the wiring line inhibition area RP is determined in accordance with the position data of the bundle of wiring lines 11 (split wiring line 10) and the wiring line width W. This is because the wiring line inhibition area RP needs to be set for the space between the split wiring lines 10. In other words, since the wiring line inhibition area RP needs to be set in relation to the bundle of wiring lines 11, [Position Data] of the bundle of wiring lines 11 is essential for the position determination of the wiring line inhibition area RP. According to the present invention, since the position data of the bundle of wiring lines 11 is used at least, the wiring line inhibition area RP is set to the position related to the position of the bundle of wiring lines 11. Attention should be paid to the fact that the position and shape of the wiring line inhibition area RP are not arbitrarily set.

Second Embodiment

Figure 4:
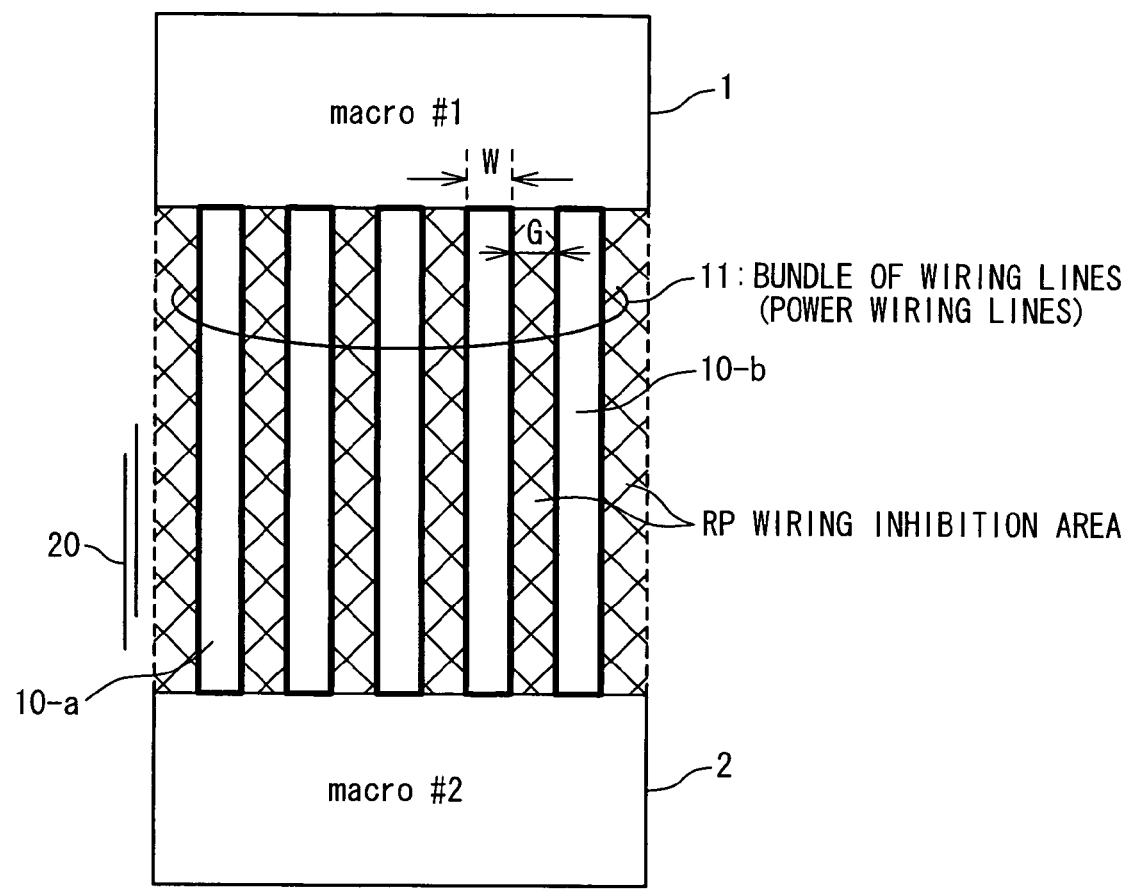
FIG. 4 is a diagram showing a method of designing diagram the semiconductor device according to a second embodiment of the present invention.

A method of supporting the designing of a semiconductor device according to the second embodiment will be described below with reference to FIG. 4. In FIG. 4, the same symbols are assigned to the components similar to those shown in FIG. 2, and the same description is properly omitted. According to the second embodiment, similarly to the first embodiment, the wiring line inhibition area RP is set to cover the space between the plurality of split wiring lines 10. Moreover, according to the second embodiment, the wiring line inhibition areas RP are set even for the outside areas of split wiring lines 10-a and 10-b on the outermost sides. The wiring line inhibition area RP of the outermost side is set to be adjacent to (in contact with) the split wiring line 10-a or 10-b.

Figure 5:
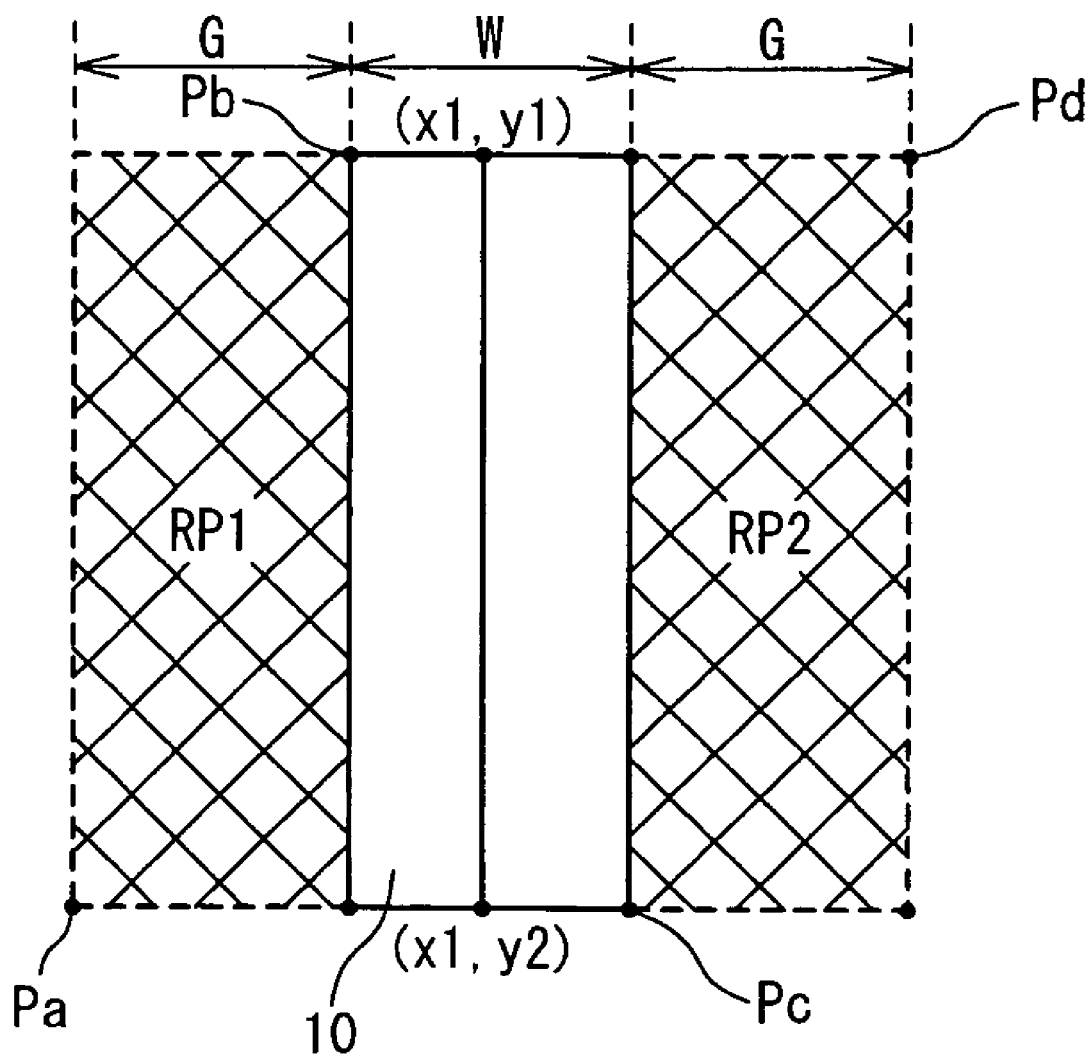
FIG. 5 is a diagram showing a method of determining the position of the wiring line inhibition area according to the second embodiment.

FIG. 5 shows one example of a method of determining the position of the wiring line inhibition area RP according to this embodiment. In FIG. 5, a certain segment (split wiring line) 10 is arranged. Its start point is given based on the coordinate (x1, y1), and its end point is given based on the coordinate (x1, y2). Also, it is supposed that the line width W of the split wiring line 10 and the line interval G between the split wiring lines 10 are set in advance. When one segment 10 is arranged, it is possible to form or set the wiring line inhibition areas RP1 and RP2 that are in contact with both sides of the one segment 10. In this embodiment, the widths of the wiring line inhibition areas RP1 and RP2 are set to be equal to the wiring line interval G between the split wiring lines 10. Specifically, the coordinates of the points Pa and Pb that define the wiring line inhibition area RP1 on the left side are represented as follows:

Point $Pa=(x1-W/2-G,y2)$

Point $Pb=(x1-W/2,y1)$

Also, the coordinates of the points Pc and Pd that define the wiring line inhibition area RP2 on the right side are represented as follows:

Point $Pc=(x1-W/2,y2)$

Point $Pd=(x1-W/2-G,y1)$

Since the widths of the wiring line inhibition areas RP1 and RP2 are equal to the wiring line interval G, it is obvious that those wiring line inhibition areas RP1 and RP2 cover areas on both sides the split wiring line 10. Since the similar processes are repeatedly performed on the respective split wiring lines 10, the wiring line inhibition area RP is obtained as shown in FIG. 4. The wiring line inhibition area RP1 for the split wiring line 10-*a* and the wiring line inhibition area RP2 for the split wiring line 10-*b* become the wiring line inhibition areas on the outermost side that are not sandwiched between the split wiring lines 10.

According to this embodiment, the effect similar to the first embodiment can be obtained. Moreover, the usual wiring line 20 is prevented from being laid in the vicinities of the split wiring lines 10-*a* and 10-*b* on the outmost side. This is because the wiring line inhibition areas RP are set even for the further outside of the split wiring lines 10-*a* and 10-*b*. For this purpose, when the positions of the wiring line inhibition areas RP are determined, it is adequate to refer to the wiring line interval G in addition to the position data of the bundle of wiring lines 11 (split wiring line 10) and the wiring line width W. In this way, since the usual wiring line 20 is prevented from being laid in the vicinities of the split wiring lines 10-*a* and 10-*b*, the occurrence of the erosion in the manufacturing process is further suppressed. Thus, the additional effect of the further suppression of the variation in the wiring line resistance value is obtained.

Third Embodiment

Figure 6:
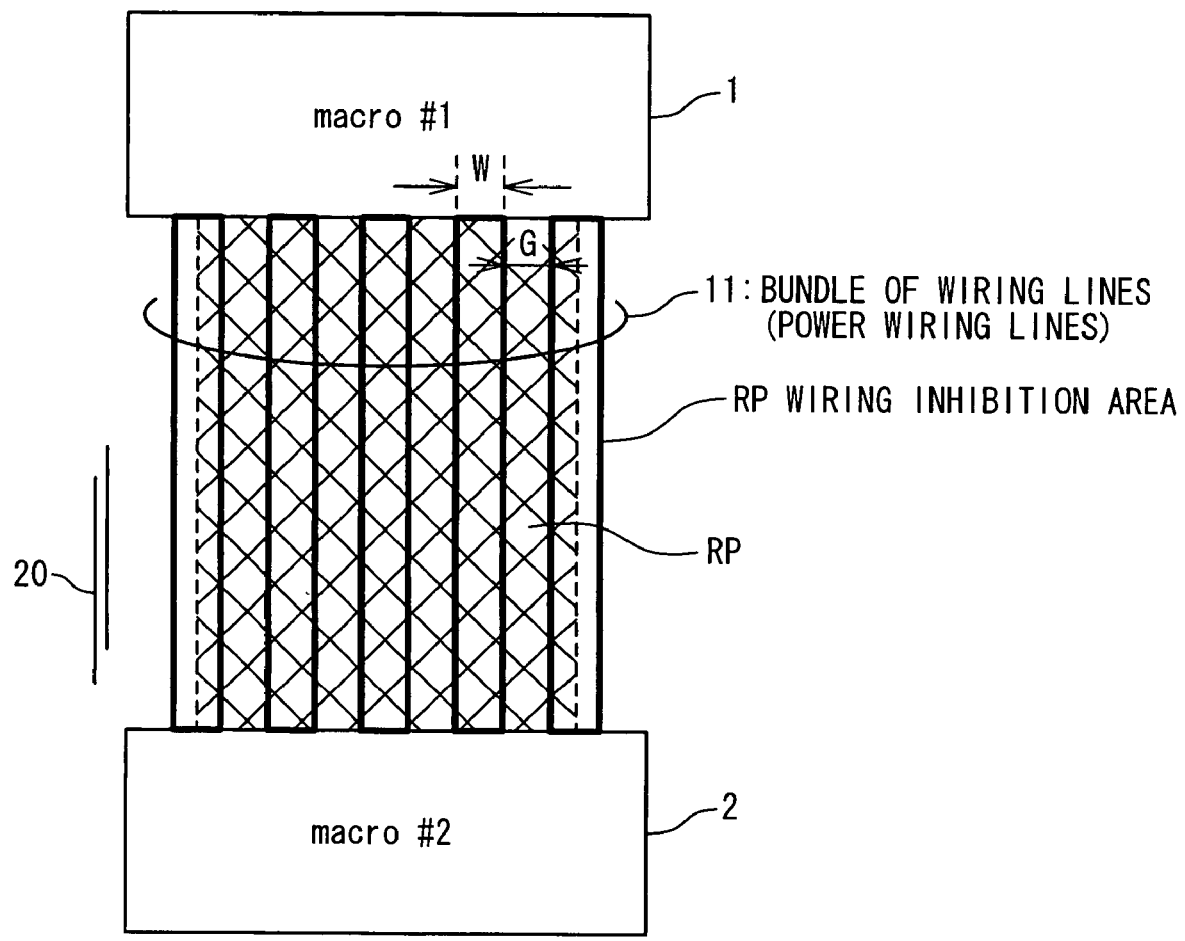
FIG. 6 is a diagram showing a method of designing the semiconductor device according to a third embodiment of the present invention.

A method of designing a semiconductor device according to the third embodiment will be described below with reference to FIG. 6. In FIG. 6, the same symbols are assigned to the components similar to those shown in FIG. 2, and the same description is properly omitted. The wiring line inhibition area RP may overlap with the split wiring line 10 itself without covering only the space between the plurality of split wiring lines 10. In short, the wiring line inhibition areas RP may be formed or set to cover a part of the plurality of split wiring lines 10, in addition toe the space between the plurality of split wiring lines 10. For example, in FIG. 6, one large wiring line inhibition area RP is formed for one bundle of wiring lines 11.

Figure 7:
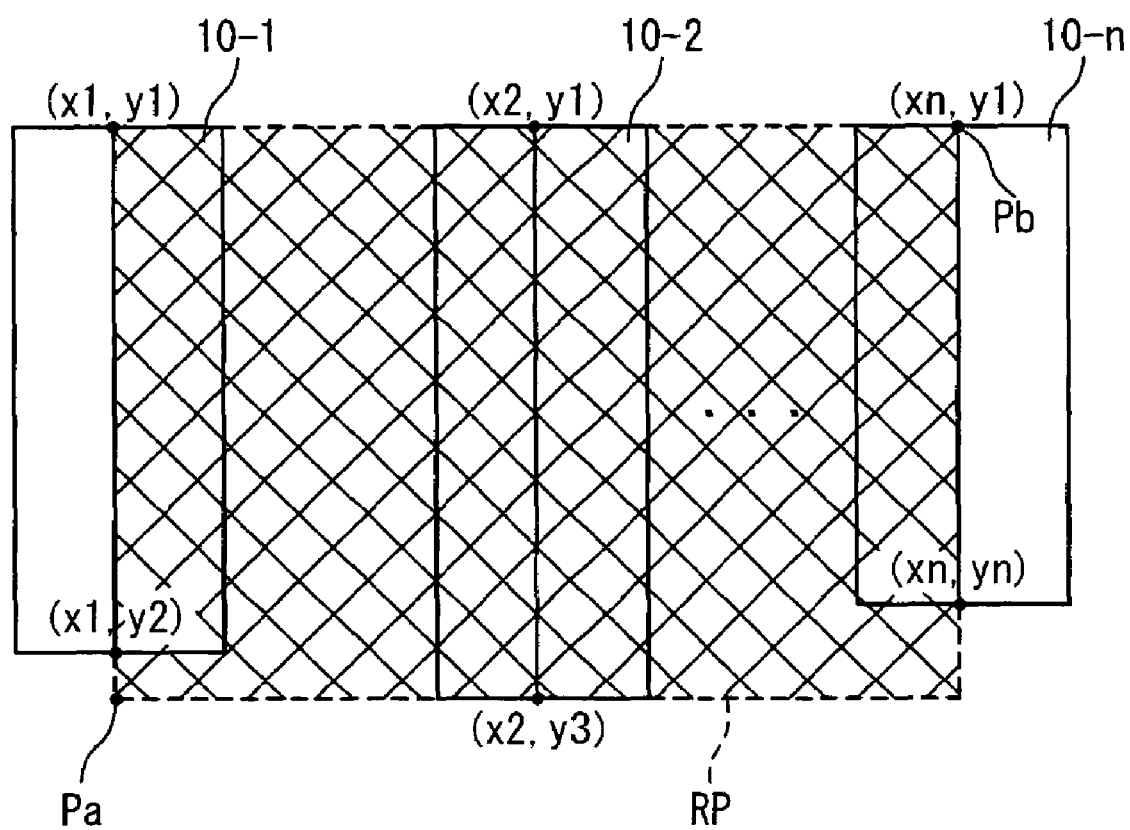
FIG. 7 is a diagram showing a method of determining the position of the wiring line inhibition area according to the third embodiment.

FIG. 7 shows one example of a method of determining the position of the wiring line inhibition area RP according to this embodiment. In FIG. 7, all segments 10-1 to 10-*n* (n is an integer of 2 or more) with regard to a certain bundle of wiring lines are arranged. The start point of the segment 10-1 is given based on the coordinate (x1, y1), and its end point is given based on the coordinate (x1, y2). The start point of the segment 10-2 is given based on the coordinate (x2, y1), and its end point is given based on the coordinate (x2, y3). The start point of the segment 10-*n* is given based on the coordinate (xn, y1), and its end point is given based on the coordinate (xn, yn). At this time, as shown in FIG. 7, "One Rectangle" that entirely covers the spaces between all of the segments can be defined. Its rectangle is defined by the following two points Pa and Pb:

Point $Pa=(x1, y3)$

Point $Pb=(xn, y1)$

Here, attention should be paid to the fact that the points Pa and Pb are represented by only the position data of the segments and they do not depend on the wiring line width W and the wiring line interval G.

The rectangle defined by those two points Pa and Pb is set as one wiring line inhibition area RP. The wiring line inhibition area RP obviously covers the spaces between all of the segments. It should be noted that as described in the foregoing examples, the wiring line inhibition area RP is preferably set to be equal to the maximal coordinate and the minimal coordinate. In other words, one rectangle that includes the start points and the end points of all of the split wiring lines 10 is preferably set as the wiring line inhibition area RP. In this case, the spaces between the segments are perfectly covered.

According to this embodiment, the effect similar to the first embodiment can be obtained. Moreover, according to the third embodiment, the position (Pa, Pb) of the wiring line inhibition area RP can be represented only by the position data (the start point, the end point) of the bundle of wiring lines 11. When the position of the wiring line inhibition area RP is determined, it is not necessary to refer to the wiring line width W and the wiring line interval G. Thus, the wiring line inhibition area RP can be set easier than the foregoing embodiments. Moreover, according to the third embodiment, only one wiring line inhibition area RP is set for one bundle of wiring lines 11. Therefore, the data amount to define the position of the wiring line inhibition area RP is reduced.

Fourth Embodiment

Figure 8:
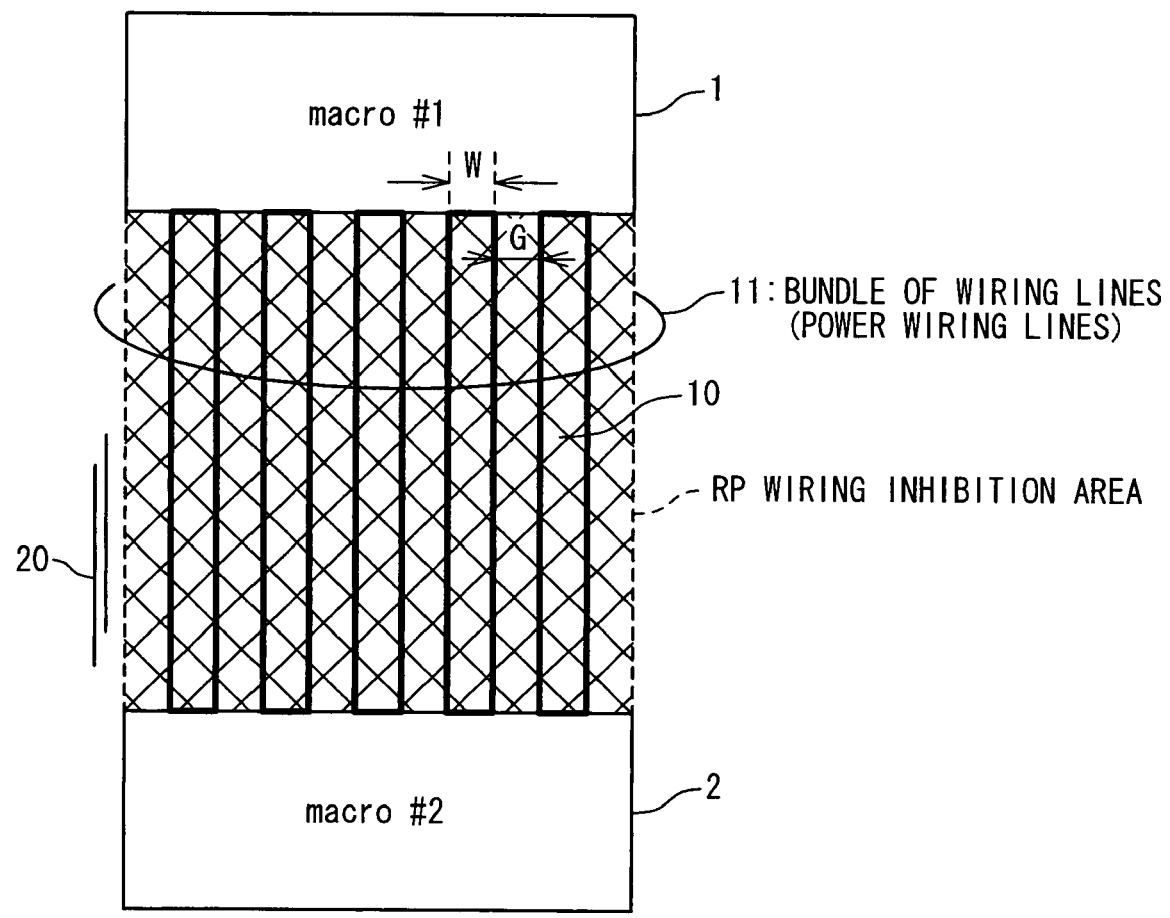
FIG. 8 is a diagram showing a method of designing the semiconductor device according to a fourth embodiment of the present invention.

A method of supporting the designing of a semiconductor device according to the fourth embodiment will be described below with reference to FIG. 8. In FIG. 8, the same symbols are assigned to the components similar to those shown in FIG. 2, and the same description is properly omitted. According to the fourth embodiment, the wiring line inhibition area RP is formed or set to cover all of the spaces between the plurality of split wiring lines 10 and the plurality of split wiring lines 10. In short, the wiring line inhibition area RP is set to cover all of the areas where the bundle of wiring lines 11 is set. For example, in FIG. 8, one large wiring line inhibition area RP is formed for one bundle of wiring lines 11.

Figure 9:
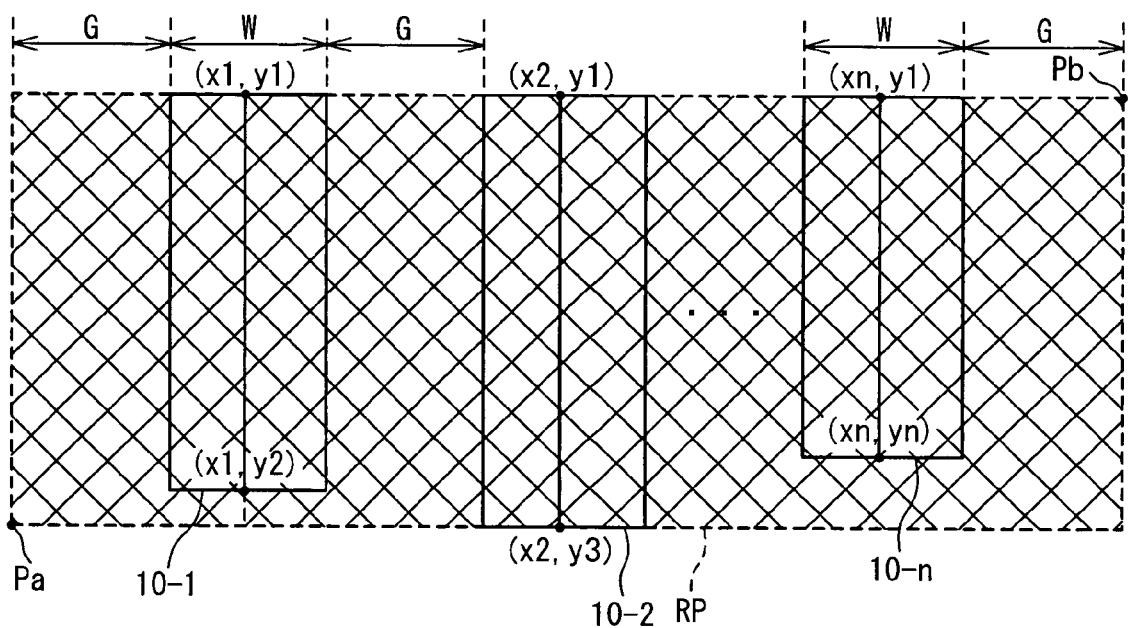
FIG. 9 is a diagram showing a method of determining the position of the wiring line inhibition area according to the fourth embodiment.

FIG. 9 shows one example of a method of determining the position of the wiring line inhibition area RP according to the fourth embodiment. In FIG. 9, all segments 10-1 to 10-*n* (n is the integer of 2 or more) with regard to a certain bundle of wiring lines are arranged. The start point of the segment 10-1 is given based on the coordinate (x1, y1), and its end point is given based on the coordinate (x1, y2). The start point of the segment 10-2 is given based on the coordinate (x2, y1), and its end point is given based on the coordinate (x2, y3). The start point of the segment 10-*n* is given based on the coordinate (xn, y1), and its end point is given based on the coordinate (xn, yn). Also, the wiring line width W of the split wiring line 10 and the wiring line interval G are assumed to be set in advance. At this time, as shown in FIG. 9, "One Rectangle" that entirely covers the spaces between all of the segments can be defined. Its rectangle is defined by the following two points Pa and Pb:

Point $Pa=(x1-W/2-G, y3)$

Point $Pb=(xn+W/2+G, y1)$

The rectangle defined based on those two points Pa and Pb is set as one wiring line inhibition area RP. The wiring line inhibition area RP obviously covers the spaces between all of the segments. Moreover, the wiring line inhibition area RP occupies even the further outside of split wiring lines 10-1 and 10-*n* on the outermost side. It should be noted that as described in the foregoing examples, the wiring line inhibition area RP is preferably set to be defined based on the maximal coordinate and the minimal coordinate. In other words, one rectangle that includes the start points and the end points of all of the split wiring lines 10 is preferably set as the wiring line inhibition area RP. In that case, the spaces between the segments are perfectly covered.

According to the fourth embodiment, the effect similar to the first embodiment can be obtained. Moreover, the usual wiring line 20 is also prevented from being laid in the vicinity of the split wiring lines 10-1, 10-n on the outermost side. This is because the wiring line inhibition area RP is set even on the further outside of the split wiring lines 10-1 and 10-n. As a result, the occurrence of the erosion in the manufacturing process is further suppressed. Therefore, the additional effect of the further suppression of the variation in the wiring line resistance value is obtained. Moreover, according to the fourth embodiment, only one wiring line inhibition area RP is set for one bundle of wiring lines 11. Therefore, the data amount to define the position of the wiring line inhibition area RP is reduced.

As described above, according to the present invention, at the layout designing stage, the wiring line inhibition area RP is set to cover the spaces between the bundle of wiring lines 11 at least. After that, the usual wiring line 20 different from the bundle of wiring lines 11 is laid in an area other than the wiring line inhibition area RP in the same wiring line layer. Thus, the occurrence of the erosion in the manufacturing process is suppressed, and the variation in the wiring line resistance caused by the erosion is suppressed. The change in the wiring line resistance value is suppressed, and the desirable wiring line resistance value is obtained, thereby improving the reliability of the manufactured semiconductor device.

Figure 10:
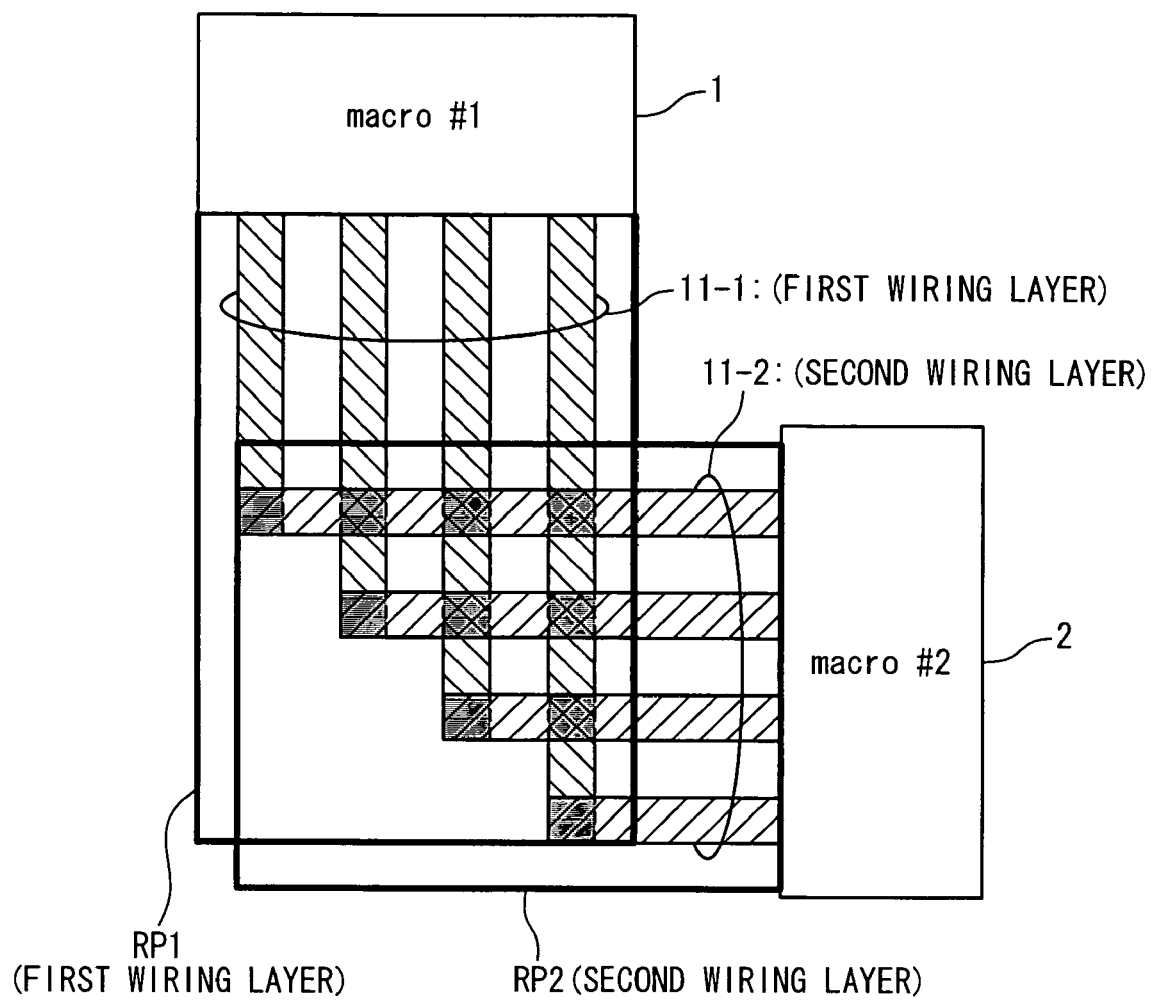
FIG. 10 is a diagram showing a method of designing the semiconductor device according to the present invention.

It should be noted that when the bundles of wiring lines 11 are located on a plurality of wiring line layers, the wiring line inhibition area RP is set for each wiring line layer. For example, in FIG. 10, the bundle of wiring lines for the connection between a first macro cell 1 and a second macro cell 2 includes a first bundle of wiring lines 11-1 in a first wiring line layer and a second bundle of wiring lines 11-2 in a second wiring line layer. The first bundle of wiring lines 11-1 and the second bundle of wiring lines 11-2 are connected through via-holes to each other. In this case, in the first wiring line layer, the first wiring line inhibition area RP1 is set in a position related to a position of the first bundle of wiring lines 11-1. Also, in the second wiring line layer, the second wiring line inhibition area RP2 is set in a position related to a position of the second bundle of wiring lines 11-2. The first wiring line inhibition area RP1 and the second wiring line inhibition area RP2 are independent of each other, and effective in the corresponding wiring line layers, respectively.

[Semiconductor Device Designing Supporting System]

Figure 11:
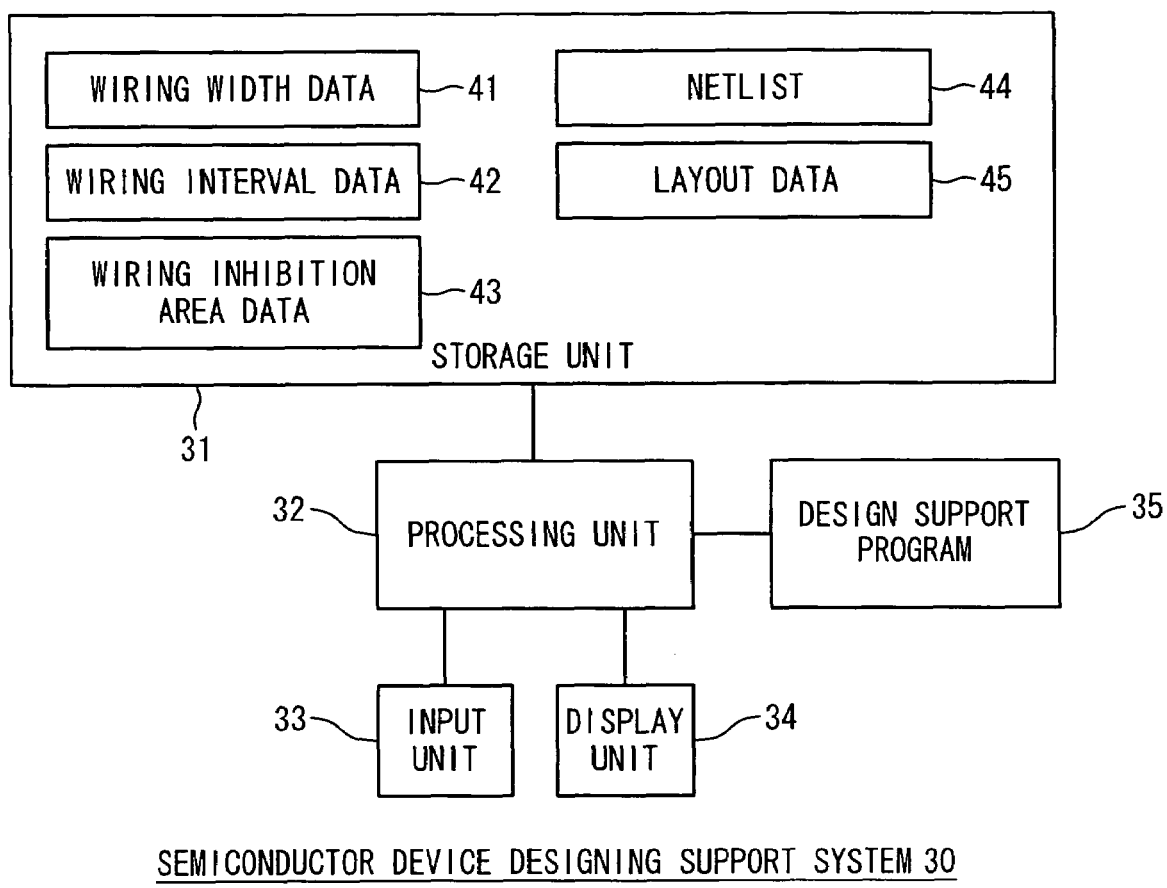
FIG. 11 is a block diagram showing a configuration of a support system for designing the semiconductor device according to the embodiment of the present invention.

FIG. 11 shows one example of a system to attain the foregoing designing support system. A semiconductor device designing support system 30 shown in FIG. 11 is a computer system that contains a storage unit 31, a processing unit 32, an input unit 33 and a display unit 34.

HDD and RAM are exemplified as the storage unit 31. The storage unit 31 stores various data. A wiring width data 41 indicates a preset wiring line width W. A wiring interval data 42 indicates a preset wiring line interval G. A wiring inhibition area position data 43 indicates a calculated position of the wiring line inhibition area RP. A net list 44 indicates a connection relation of a desirable semiconductor device. A layout data 45 indicates a layout of the semiconductor device after a layout design.

The processing unit 32 can access the storage unit 31. A keyboard and a mouse are exemplified as the input unit 33. A designer or user can use the input unit 33 to set the wiring line width W and the wiring line interval G and to input various commands. Also, the designer, while referring to data displayed on the display unit 34, can carry out the layout design.

Moreover, the semiconductor device designing support system 30 has a design support program (layout program) 35. This design support program 35 is computer software that is executed by the processing unit 32. Also, the design support program 35 may be recorded in a computer-readable recording medium. The design support program 35 and the processing unit 32 are used to establish the system for executing the following circuit designing process.

Figure 12:
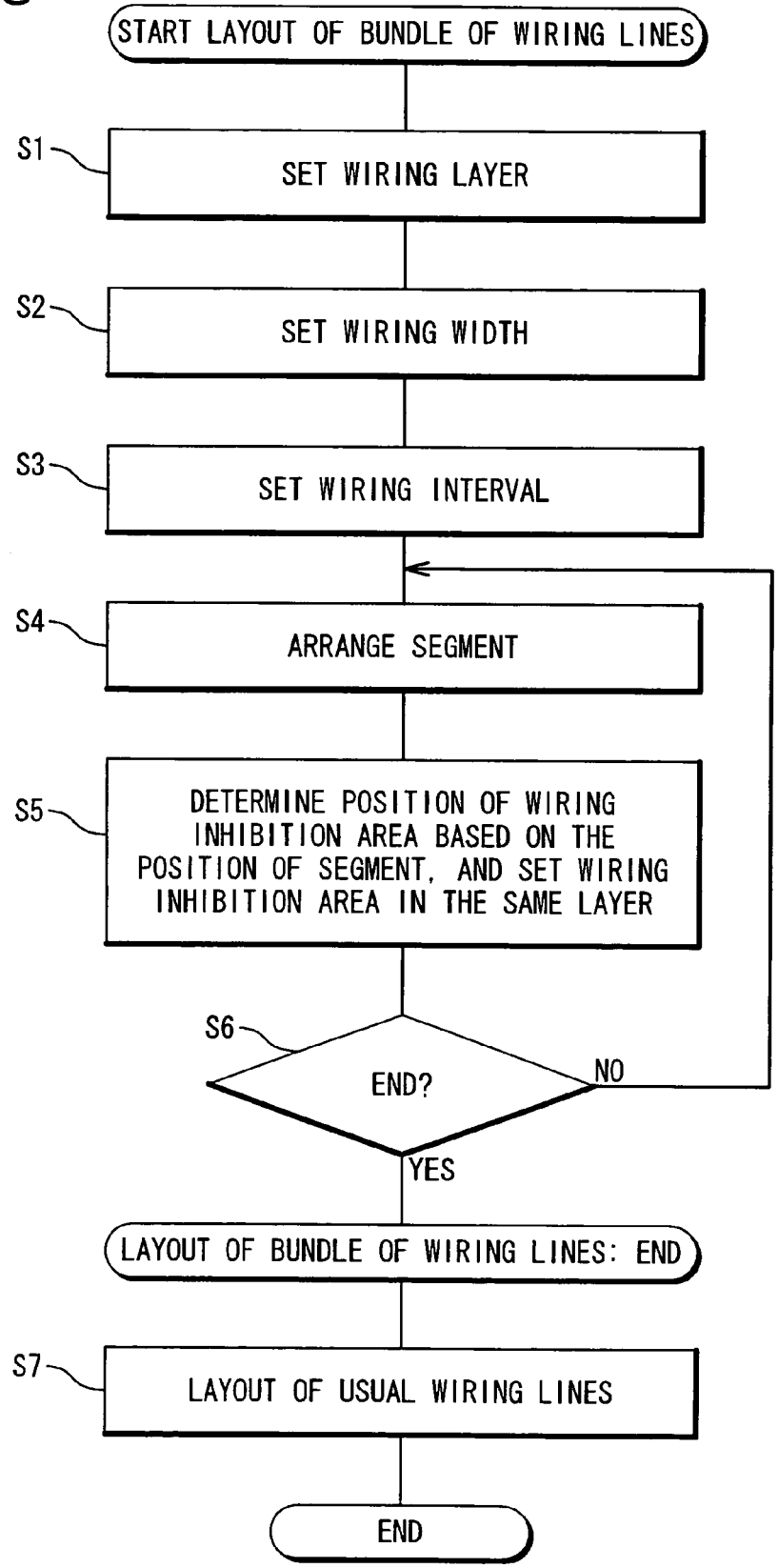
FIG. 12 is a flowchart showing a support method for designing the semiconductor device according to the embodiment of the present invention.

FIG. 12 is a flowchart that summarizes the layout method of wiring lines according to the present invention. At first, the layout of the bundle of wiring lines 11 is executed. Specifically, one wiring line layer is specified as a layout target (Step S1). For example, it is specified by the designer who uses the input unit 33. Next, the wiring line width W is set (Step S2), and the wiring line interval G is set (Step S3). They are set by the designer who uses the input unit 33. Consequently, the wiring width data 41 and the wiring interval data 42 are generated and stored in the storage unit 31 by the system.

Next, the segments 10 constituting the bundle of wiring lines 11 are arranged in the wiring line layer specified at the step S1 (Step S4). When the segments are arranged, the start points and the end points of the segments (the position data) are given as already shown in FIGS. 3, 5, 7 and 9. For example, the designer can use the input unit 33 and give the position data of the segments. Also, the system reads out the wiring width data 41 and the wiring interval data 42 from the storage unit 31, respectively. The layout of each segment of the bundle of wiring lines 11 is executed in accordance with the position data, the wiring width data 41 and the wiring interval data 42.

Next, the wiring line inhibition area RP is set for the same wiring line layer (Step S5). The position of the wiring line inhibition area RP is determined as described in the first to fourth embodiments. That is, the position of the wiring line inhibition area RP is determined in accordance with the position data of the segment (the bundle of wiring lines 11) at least. This is because the wiring line inhibition area RP needs to be set for the space(s) in the bundle of wiring lines 11. In other words, since the wiring line inhibition area RP needs to be set in relation to the bundle of wiring lines 11, [Position Data] of the bundle of wiring lines 11 is inevitable. The data with regard to the wiring line width W and the wiring line interval G may be used as necessary. Attention should be paid to the fact that the position and shape of the wiring line inhibition area RP are not arbitrarily set. The thus-determined position of the wiring line inhibition area RP is stored as the wiring inhibition area position data 43 in the storage unit 31.

Thereafter, similarly, the layouts of the other segments and other bundles of wiring lines are executed (Step S6; No). If all of the layouts of the bundles of wiring lines 11 in the wiring line layer specified at the step S1 have been completed (Step S6; Yes), the layout of the usual wiring line 20 in the wiring line layer is executed (Step S7). The layout of this usual wiring line 20 is automatically executed by the system. Here, together with the net list 44, the previously generated wiring inhibition area position data 43 is referred. The usual wiring line 20 is not laid in the wiring line inhibition area RP indicated in the wiring inhibition area position data 43.

In this way, the layout design of the semiconductor device is executed. The layout data 45 indicating the designed layout is stored in the storage unit 31. After that, a reticle is manufactured in accordance with the layout data 45, and the designed semiconductor device is manufactured.

[Semiconductor Device]

Figure 13:
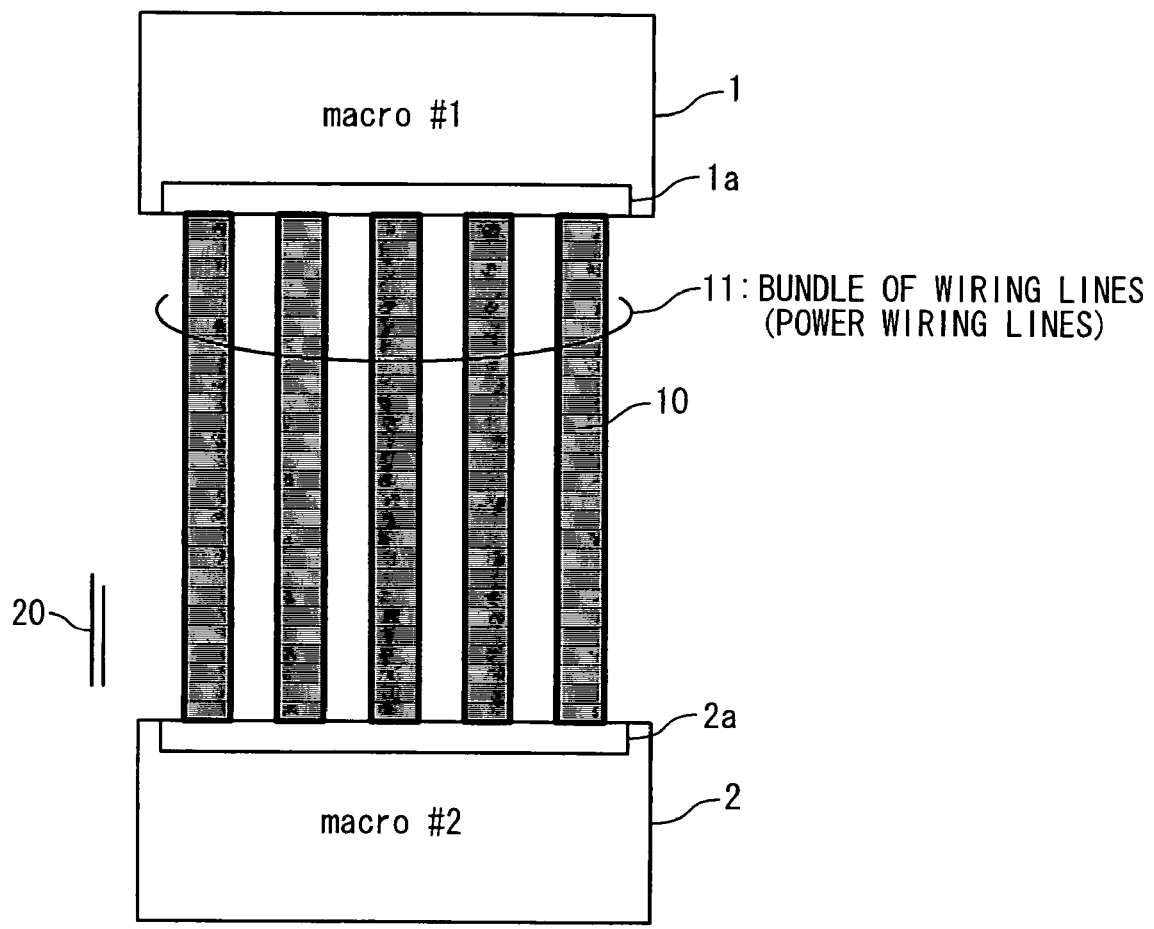
FIG. 13 is a diagram showing a structure of the semiconductor device according to the embodiment of the present invention.

FIG. 13 schematically shows the structure of a semiconductor device according to the present invention. The semiconductor device according to the present invention contains a first macro cell 1 having a first terminal 1a, a second macro cell 2 having a second terminal 2a, and a bundle of wiring lines 11 composed of a plurality of split wiring lines 10. Analog circuits are exemplified as the first macro cell 1 and the second macro cell 2.

The plurality of split wiring lines 10 are connected in parallel between the first terminal 1a and the second terminal 2a and send the same signal between the macro cells 1 and 2. In short, all of the plurality of split wiring lines 10 have the same voltage. For example, the plurality of split wiring lines 10 constitute a power supply wiring line to supply the same power supply voltage between the analog circuits. The number of the split wiring lines 10 is exemplified between 50 and 100. In order to reduce the wiring line resistance value, Cu is used as the material of the bundle of wiring lines 11. The wiring line width of each split wiring line 10 is, for example, 1 μm.

Moreover, the semiconductor device contains the usual wiring line 20 other than the bundle of wiring lines 11. A logic wiring line for the connection between the macro cells is exemplified as the usual wiring line 20, and its resistance value is not especially limited. The usual wiring line 20 is thinner than the split wiring line 10, and its wiring line width is 0.1 μm, for example. Also, the lower limit of the wiring line interval between the usual wiring lines 20 is set to be extremely thinner than the wiring line interval between the split wiring lines 10. According to this embodiment, in the wiring line layer where the bundle of wiring lines 11 is formed, the usual wiring lines 20 are not formed between the plurality of split wiring lines 10. In other words, the usual wiring lines 20 are formed in an area other than the spaces between the plurality of split wiring lines 10. This fact implies that a variation in the wiring line resistance value caused by erosion is prevented. Thus, the semiconductor device according to the present invention has the excellent reliability.

According to the present invention, in the automatic layout, the usual wiring line is protected from invading in spaces of the bundle of wiring lines. Thus, the occurrence of erosion in the manufacturing process is suppressed, and a variation in the wiring line resistance caused by the erosion is suppressed. A change in the wiring line resistance value is suppressed, and a desirable wiring line resistance value is obtained, thereby improving the reliability of the manufactured semiconductor device.

What is claimed is:

1. A support method of designing a semiconductor device, comprising:
   arranging at least three wiring lines in parallel in a wiring line layer to transfer a same signal, wherein the wiring lines are positioned equidistant apart;
   setting a wiring line inhibition area in said wiring line layer to cover a space between said wiring lines and to inhibit arrangement of another wiring line other than said wiring lines, wherein said arranging step and said setting step respectively produce split wiring line layout data and inhibition area position data;
   completing a design layout for a semiconductor device using said split wiring line layout data and said inhibition area position data; and
   storing the design layout in a physical storage unit.

2. The support method according to claim 1, further comprising:
   arranging said another wiring line in an area of said wiring line layer other than said wiring line inhibition area.

3. The support method according to claim 2, wherein a wiring line width and a wiring line interval between said wiring lines are wider than those of said another wiring line.

4. The support method according to claim 1, wherein said setting comprises:
   setting said wiring line inhibition area to cover areas outside said wiring lines in addition to said spaces between said wiring lines.

5. The support method according to claim 4, wherein said wiring line inhibition area outside said wiring lines contacts a leftmost wiring line or a rightmost wiring line and said outer area has a same width as said space between said plurality of wiring lines.

6. The support method of designing a semiconductor device according to claim 5, wherein said wiring line inhibition area outside said wiring lines contacts the leftmost wiring line and the rightmost wiring line and the outer areas have the same width as said space between said plurality of wiring lines.

7. The support method according to claim 1, wherein said setting comprises:
   setting said wiring line inhibition area to cover at least a part of said wiring lines in addition to said space between said plurality of wiring lines.

8. The support method according to claim 7, wherein said setting comprises:
   setting said wiring line inhibition area as a rectangular area to cover all of said wiring lines.

9. The method of claim 1, further comprising the step of manufacturing a reticle from said stored design layout.

10. The method of claim 1, wherein the physical storage unit is a computer hard disk drive.

11. A support method of designing a semiconductor device, comprising:
    arranging at least three wiring lines in parallel and equidistant apart in a wiring line layer to transfer a same signal;
    setting a wiring line inhibition area in said wiring line layer based on position data of said wiring lines to inhibit arrangement of another wiring line in a portion of said wiring line layer related to said wiring lines, wherein said arranging step and said setting step respectively produce split wiring line layout data and inhibition area position data;
    completing a design layout for the semiconductor device using said split wiring line layout data and said inhibition area position data; and
    storing the design lay out in a physical storage unit.

12. The support method according to claim 11, wherein said wiring line inhibition area is set to cover a space between said wiring lines in said wiring line layer.

13. The support method according to claim 11, further comprising:
    arranging said another wiring line in said wiring line layer.

14. The support method according to claim 11, wherein said wiring line inhibition area overlaps at least a portion of said wiring lines in said wiring line layer.

15. The support method according to claim 14, wherein said wiring line inhibition area completely overlaps said wiring lines in said wiring line layer.

16. The method of claim 11, further comprising the step of manufacturing a reticle from said stored design layout.

17. The method of claim 11, wherein the physical storage unit is a computer hard disk drive.

18. A support method of designing a semiconductor device, comprising:

arranging a plurality of wiring lines in parallel in a wiring line layer to transfer a same signal; and setting a wiring line inhibition area in said wiring line layer to cover a space between said plurality of wiring lines and to inhibit arrangement of another wiring line other than said plurality of wiring lines;

setting said wiring line inhibition area to cover areas outside said plurality of wiring lines in addition to said spaces between said plurality of wiring lines, wherein said wiring line inhibition area outside said plurality of wiring lines contacts a leftmost wiring line or a rightmost wiring line and said outer area has a same width as said space between said plurality of wiring lines;

completing a design layout for a semiconductor device using said set wiring line inhibition area; and storing the design layout in a physical storage unit.

19. The support method of designing a semiconductor device according to claim 18, wherein said wiring line inhibition area outside said wiring lines contacts the leftmost wiring line and the rightmost wiring line and the outer areas have the same width as said space between said plurality of wiring lines.

20. The method of claim 18, further comprising the step of manufacturing a reticle from said stored design layout.

* * * * *